(12) United States Patent
Fetzer et al.

(10) Patent No.: US 9,891,286 B2
(45) Date of Patent: Feb. 13, 2018

(54) METHOD AND CIRCUIT ARRANGEMENT FOR DETERMINING THE COULOMBIC EFFICIENCY OF BATTERY MODULES

(71) Applicants: Robert Bosch GmbH, Stuttgart (DE); Samsung SDI Co., Ltd., Yongin-si, Gyeonngi-do (KR)

(72) Inventors: Joachim Fetzer, Bad-Ditzenbach (DE); Holger Fink, Stuttgart (DE); Hans Partes, Asperg (DE)

(73) Assignees: Robert Bosch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/114,793

(22) PCT Filed: Jan. 23, 2015

(86) PCT No.: PCT/EP2015/051389
§ 371 (c)(1),
(2) Date: Jul. 27, 2016

(87) PCT Pub. No.: WO2015/110595
PCT Pub. Date: Jul. 30, 2015

(65) Prior Publication Data
US 2017/0115356 A1    Apr. 27, 2017

(30) Foreign Application Priority Data

Jan. 27, 2014 (DE) .................. 10 2014 201 363

(51) Int. Cl.
*G01R 31/36* (2006.01)
*B60L 11/18* (2006.01)
*H02J 7/00* (2006.01)

(52) U.S. Cl.
CPC ...... *G01R 31/3658* (2013.01); *B60L 11/1853* (2013.01); *B60L 11/1855* (2013.01);
(Continued)

(58) Field of Classification Search
CPC ............ G01R 31/3658; G01R 31/3634; G01R 31/3679; B60L 11/1855; B60L 11/1857;
(Continued)

(56) References Cited

U.S. PATENT DOCUMENTS 5,642,275 A * 6/1997 Peng ..................... H02M 7/49
363/137
6,329,792 B1 * 12/2001 Dunn ................. G01R 31/3658
320/130

(Continued)

FOREIGN PATENT DOCUMENTS

DE   10 2011 075 421 A1   11/2012
DE   10 2011 089 312 A1   6/2013
(Continued)

OTHER PUBLICATIONS

International Search Report corresponding to PCT Application No. PCT/EP2015/051389, dated Apr. 1, 2015 (German and English language document) (7 pages).
(Continued)

*Primary Examiner* — Patrick Assouad
*Assistant Examiner* — Khristopher Yodichkas
(74) *Attorney, Agent, or Firm* — Maginot, Moore & Beck LLP (57) ABSTRACT

The disclosure describes a method for determining a coulombic efficiency of battery modules of a rechargeable battery using a circuit arrangement connected to the battery modules and that has a plurality of switching modules for selectively connecting every single one of the battery modules in a common current path or for alternatively isolating (Continued)

every single one of the battery modules from the common current path and from at least one power semiconductor element, which can be operated in linear mode, for regulating the current that flows through the current path. The switching modules are used to select at least one of the battery modules and to connect it in the current path while all other battery modules are isolated from the current path by the switching modules. The selected battery module is subjected to at least one discharge process and at least one charging process via the current path.

8 Claims, 5 Drawing Sheets

(52) U.S. Cl.
CPC ....... *B60L 11/1857* (2013.01); *B60L 11/1859* (2013.01); *B60L 11/1861* (2013.01); *B60L 11/1866* (2013.01); *G01R 31/3627* (2013.01); *G01R 31/3634* (2013.01); *G01R 31/3679* (2013.01); *H02J 7/0024* (2013.01); *H02J 7/0057* (2013.01); *B60L 2210/42* (2013.01); *B60Y 2200/91* (2013.01); *B60Y 2200/92* (2013.01); *B60Y 2400/112* (2013.01); *G01R 31/3637* (2013.01)

(58) Field of Classification Search
CPC .............. B60L 11/1859; B60L 11/1861; B60L 11/1866; B60L 2210/42; B60Y 2200/91; B60Y 2200/92; B60Y 2400/112

USPC .................................. 324/434; 320/116–122
See application file for complete search history.

(56) References Cited

U.S. PATENT DOCUMENTS

| | | | |
|---|---|---|---|
| 2004/0162683 | A1 | 8/2004 | Verbrugge et al. |
| 2010/0261048 | A1 | 10/2010 | Kim et al. |
| 2011/0198936 | A1 | 8/2011 | Graovac |
| 2011/0286137 | A1* | 11/2011 | Bosch ................. B60L 3/04 361/78 |
| 2012/0046892 | A1* | 2/2012 | Fink ................. G01R 31/3658 702/63 |
| 2012/0153880 | A1 | 6/2012 | Cerrato et al. |
| 2016/0211767 | A1* | 7/2016 | Hotta ................. H02M 1/08 |

FOREIGN PATENT DOCUMENTS

| | | |
|---|---|---|
| DE | 10 2012 209 660 A1 | 12/2013 |
| DE | 10 2012 210 602 A1 | 12/2013 |
| WO | 99/01918 A2 | 4/1999 |

OTHER PUBLICATIONS

Smith et al.; Precision Measurements of the Coulombic Efficiency of Lithium-Ion Batteries and of Electrode Materials for Lithium-Ion Batteries; Journal of The Electrochemical Society; 2010; pp. A196-A202; vol. 157, Issue No. 2; The Electrochemical Society.

Kennedy et al.; Use of lithium-ion batteries in electric vehicles; Journal of Power Sources; Feb. 16, 2000; pp. 156-162; vol. 90; Elsevier Science.

* cited by examiner

METHOD AND CIRCUIT ARRANGEMENT FOR DETERMINING THE COULOMBIC EFFICIENCY OF BATTERY MODULES

This application is a 35 U.S.C. § 371 National Stage Application of PCT/EP2015/051389, filed on Jan. 23, 2015, which claims the benefit of priority to Serial No. DE 10 2014 201 363.1, filed on Jan. 27, 2014 in Germany, the disclosures of which are incorporated herein by reference in their entirety.

The disclosure relates to a method and a circuit arrangement for determining the Coulombic efficiency of battery modules of a rechargeable battery.

BACKGROUND

Vehicles having an electric or hybrid drive need rechargeable batteries (traction batteries), which generally have a modular structure, to operate their electrical drive machine. In many applications, such rechargeable batteries are differently also referred to as storage batteries. In order to now supply the electrical drive machine of the electric or hybrid drive with electrical energy from the batteries, a circuit arrangement is interposed between the battery modules and the drive machine.

The rechargeable batteries, usually based on lithium, used in electrically driven vehicles have only a limited service life on account of parasitic chemical processes in their interior. Their capacity is reduced with each charging/discharging cycle until the individual battery cells or the battery modules consisting of such cells have to be replaced owing to a lack of performance and capacity. Therefore, it is important to accurately observe the aging process of the battery cells or battery modules. Various methods and apparatuses for monitoring the aging state are known from the prior art.

The scientific article "Smith, A. J. et al., J. Electrochem. Soc. 157, A196 (2010)" describes a method which can be used to infer changes in the aging state (change in the SOH: State of Health) of lithium ion battery cells from the so-called Coulombic efficiency. However, a corresponding additional power electronic measuring and regulating device is needed to carry out such a method.

The method according to the disclosure provides the advantage that no additional power electronics are required.

In the method according to the disclosure for determining the Coulombic efficiency $C_E$ of battery modules of a rechargeable battery, provision is made for the Coulombic efficiency to be determined by means of a circuit arrangement which is connected to the battery modules and has a plurality of switching modules for selectively connecting each individual battery module of the battery modules in a common current path or for alternatively removing each individual battery module of the battery modules from this current path and at least one power semiconductor element which can be operated in the linear mode and is intended to regulate the current flowing through the current path. In this case, (i) at least one of the battery modules is selected and is connected in the current path by means of the switching modules, while all other battery modules are removed from the current path by means of the switching modules, and (ii) the selected battery module is subjected to at least one discharging process and at least one charging process via the current path, the corresponding current being accurately set during charging and discharging of this battery module in the current path by means of the power semiconductor element which is operated in the linear mode, and the corresponding charge quantities $Q_{ab}$, $Q_{zu}$ during charging and discharging or variables proportional to these charge quantities being determined by integrating the current over time. The Coulombic efficiency $C_E$ defined as $$C_E = \frac{Q_{ab}}{Q_{zu}}$$

can then be determined from the charge quantities $Q_{ab}$, $Q_{zu}$ or variables proportional to the latter. In the simplest case, each of the battery modules consists of an individual battery cell. Alternatively, each of the battery modules consists of a series circuit of a plurality of battery cells.

The circuit arrangement is interposed between the battery modules of the rechargeable battery and a consumer to be supplied by the battery or batteries, each battery module being connected to a switching module of the circuit arrangement. During normal operation, the switching modules are used to select individual battery modules for this voltage supply and to connect them to one another in a current path. Such a circuit arrangement is known as a battery direct converter. The battery direct converter can be interposed directly, that is to say without further intermediate elements, between the battery modules, on the one hand, and the electrical consumer to be supplied by the battery modules.

The essence of the disclosure is to control a power semiconductor element in the current path of the circuit arrangement in such a manner that said element is at least sometimes in the linear mode and the current through the battery cells of the corresponding battery module is regulated very accurately with the aid of this linearly operated power semiconductor element in accordance with current regulation in the charger. A power semiconductor element which can be operated in this manner is generally present in battery direct converters anyway. Therefore, the very accurate setting of the charging or discharging current, which is needed to determine the Coulombic efficiency $C_E$, can be easily implemented without additional power electronics. Only the control of said power semiconductor element would have to be supplemented in order to carry out the method according to the disclosure. However, such control can manage without power electronic components.

The consumer to be supplied by the battery modules is preferably a multiphase electrical consumer, in particular a multiphase electrical machine. In this case, the battery direct converter is a multiphase direct converter which can be interposed directly between the battery modules of the batteries, on the one hand, and the multiphase electrical consumer to be supplied by the battery modules. In this case, the battery modules can be connected in a number of current paths corresponding to the number of phases.

According to one advantageous development of the disclosure, one of the power semiconductor elements of the switching modules forms the power semiconductor element for regulating the current flowing through the current path. In this embodiment, the power semiconductor elements of the switching modules are controlled by means of a control device and are operated in the linear mode in order to set the electrical current during the charging process and the discharging process.

Each of the switching modules advantageously has two power semiconductor elements which act as semiconductor valves and two freewheeling diodes. They are connected in a bridge circuit arrangement in the form of a half-bridge. In this case, one of the two semiconductor valves is connected in parallel with one of the two freewheeling diodes. The two parallel circuits with the one semiconductor valve and the one freewheeling diode each are connected in a series circuit, thus producing the half-bridge. This series circuit is connected to the corresponding battery module. Such switching modules are known from direct converters, for example, and are used there for so-called "cell balancing", the equalization of the state of charge between the individual battery cells or battery modules. For this purpose, the battery cells or battery modules are preferably connected, by means of the switching modules, in the current path whose state of charge is relatively high.

According to another advantageous development of the disclosure, the circuit arrangement also has an inverter for connection to an electrical consumer which requires AC voltage or alternating current.

Provision is advantageously made for a power semiconductor element of the inverter to form the power semiconductor element for regulating the current flowing through the current path. In this embodiment, this power semiconductor element of the inverter is therefore controlled by means of a control device and is operated in the linear mode in order to set the electrical current during the charging process and the discharging process.

According to yet another advantageous development of the disclosure, the inverter has a DC voltage intermediate circuit. An intermediate circuit capacitor is connected in this DC voltage intermediate circuit.

The selected battery module is preferably discharged via the electrical consumer connected to the inverter, or a connectable load resistor of the circuit arrangement, or a short circuit in the inverter. The connectable load resistor is advantageously arranged in the intermediate circuit and is selectively connected or disconnected by means of a controllable switching device (a contactor).

The selected battery module is preferably charged via a charger connected to the current path.

The disclosure also relates to a circuit arrangement for determining the Coulombic efficiency of battery modules of a rechargeable battery. The circuit arrangement comprises a plurality of switching modules for selectively connecting each individual battery module of the battery modules in a common current path or for alternatively removing each individual battery module of the battery modules from the current path and at least one power semiconductor element which can be operated in the linear mode and is intended to regulate the current flowing through the current path. The switching modules are set up to select at least one of the battery modules and to connect it in the current path and to remove all other modules from the current path. The circuit arrangement is set up to subject the selected battery module to at least one discharging process and at least one charging process via the current path, the corresponding current in the current path being able to be accurately set during charging and discharging of this battery module by means of the power semiconductor element which is operated in the linear mode, and the circuit arrangement having means for determining the corresponding charge quantities by integrating the current over time during the charging process and the discharging process. The circuit arrangement also comprises a control device for controlling the power semiconductor element in the linear mode in order to set the electrical current during the charging process and the discharging process.

BRIEF DESCRIPTION OF THE DRAWINGS

The disclosure is explained in more detail below using FIGS., in which.

DETAILED DESCRIPTION

Figure 1:
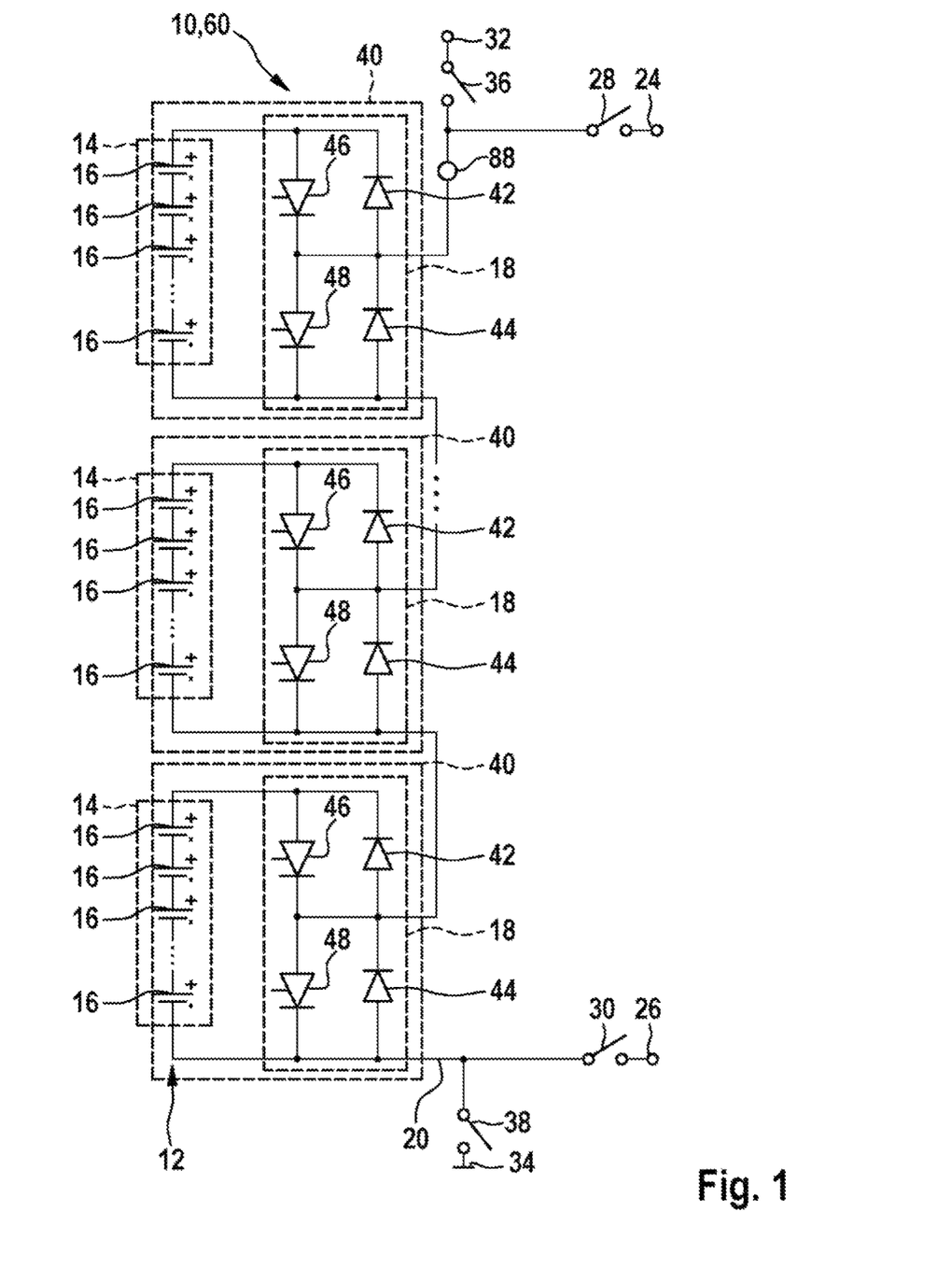
FIG. 1 shows a rechargeable battery having a plurality of battery modules and a first part of a circuit arrangement for determining the Coulombic efficiency of the battery modules according to one preferred embodiment of the disclosure.

FIG. 1 shows a first part of a circuit arrangement 10 having a rechargeable battery 12 (a storage battery) which is connected in the latter and has a modular structure and in which a plurality of battery modules 14 can be connected in series. Each of these battery modules 14 in turn has a plurality of battery cells 16 connected in series in the example shown. Alternatively, however, each of these battery modules may also have only one battery cell.

Figure 2:
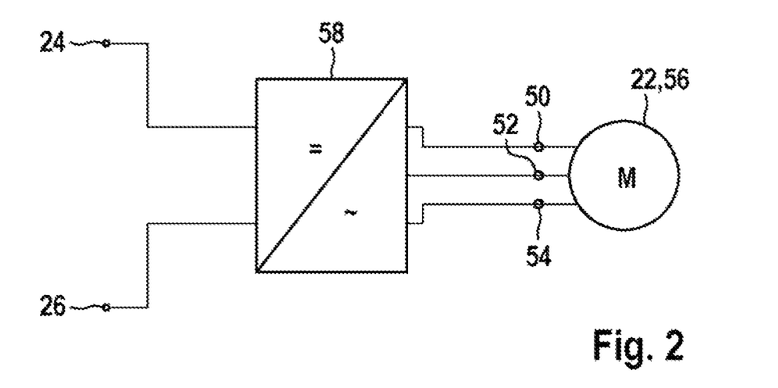
FIG. 2 shows a second part of the circuit arrangement having an inverter to which an electrical consumer is connected.

The circuit arrangement 10 connected to the battery modules 14 comprises a plurality of switching modules 18. In this case, one switching module 18 is connected to each of the battery modules 14. The switching modules 18 are used to selectively connect each individual battery module of the battery modules 14 in a common current path 20 of the circuit arrangement 10 or to alternatively remove each individual battery module of the battery modules 14 from this current path 20. In this case, the current path 20 is the power current path of the circuit arrangement 10. The rechargeable battery 12 is connected to an electrical consumer 22 (shown in FIG. 2) or to a charger (not shown) via this current path 20. As stated, FIG. 1 shows only a first part of the circuit arrangement 10, while FIG. 2 shows the second part of this circuit arrangement 10. The two parts of the circuit arrangement 10 are connected to one another via connections 24, 26. In order to connect the current path 20 to the consumer 22 in the second part of the circuit arrangement 10, corresponding first contactors 28, 30 must be closed. The connections 32, 34 are provided for the purpose of alternatively connecting the current path 20 to the charger (not shown), in which case these two connections 32, 34 can be connected to the current path 20 via a second contactor 36, 38 in each case.

In the example shown in FIG. 1, one battery module 14 is combined with the respective switching module 18, which selectively connects this battery module 14 into a section of the current path 20 or removes the battery module from this section and instead short-circuits the section, to form a respective unit 40. In this case, each of the switching modules 18 has a bridge circuit (half-bridge circuit) with a voltage divider having two freewheeling diodes 42, 44 and with a further voltage divider having two power semiconductor elements 46, 48, the power semiconductor elements 46, 48 acting as semiconductor valves.

As stated, FIG. 2 shows the second part of the circuit arrangement 10 and the consumer 22 connected to this circuit arrangement 10. For this purpose, an inverter 58 is interposed between the connections 24, 26 and the connections 50, 52, 54 of the consumer 22 in the form of a three-phase motor 56. In this case, the DC voltage part of the inverter 58 of the battery 12 and the AC voltage part face the consumer 22.

The circuit arrangement 10 is in the form of a battery direct converter 60 which directly connects the battery modules 14 of a battery 12 to an electrical consumer 22 in order to supply the latter with electrical energy.

Figure 3:
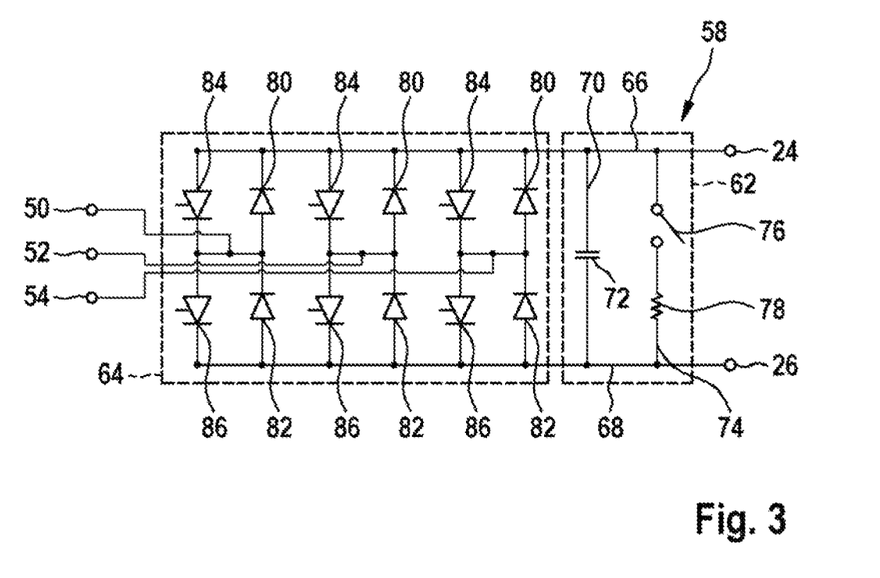
FIG. 3 shows a specific embodiment of the inverter from FIG. 2.

FIG. 3 shows an embodiment of the inverter 58 in detail. The DC voltage part of the inverter 58 is formed by a DC voltage intermediate circuit 62, and the AC voltage part is formed by a switching device 64 for generating an AC voltage or an alternating current for the consumer 22. The inverter 58 has two busbars 66, 68 on which the electrical potentials of the DC voltage intermediate circuit 62 lie and which are connected to the connections 24, 26 inside the circuit arrangement 10. The DC voltage intermediate circuit 62 also has a first current path 70, which connects the busbars 66, 68 and has an intermediate circuit capacitor 72, and a second current path 74, which connects the busbars 66, 68 and has a contactor 76 and a load resistor 78 which can be connected by means of the contactor 76.

For each phase or connection 50, 52, 54, the switching device 64 has a bridge circuit (H circuit) with a voltage divider having two freewheeling diodes 80, 82 and with a further voltage divider having two power semiconductor elements 84, 86 between the busbars 66, 68. This switching device 64 is used to generate the AC voltage or the alternating current for the consumer 22.

The power semiconductor elements 46, 48 of the switching modules 18 and/or the power semiconductor elements 84, 86 of the switching device 64 of the inverter 58 are power semiconductor devices 68 which can be operated in the linear mode.

Figure 4:
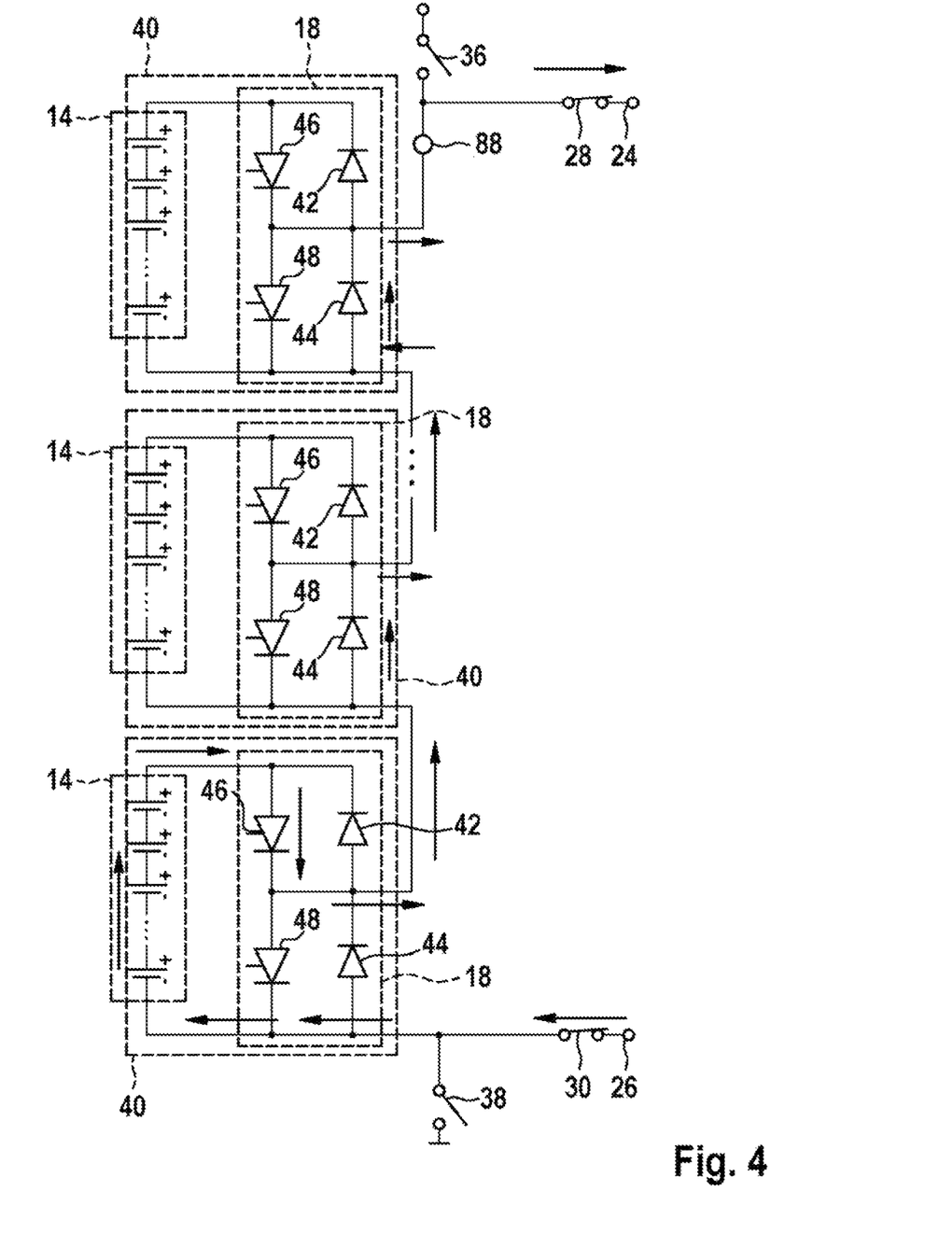
FIG. 4 shows the current course when discharging a first battery module of the battery inside that part of the circuit arrangement which is shown in FIG. 1.
Figure 5:
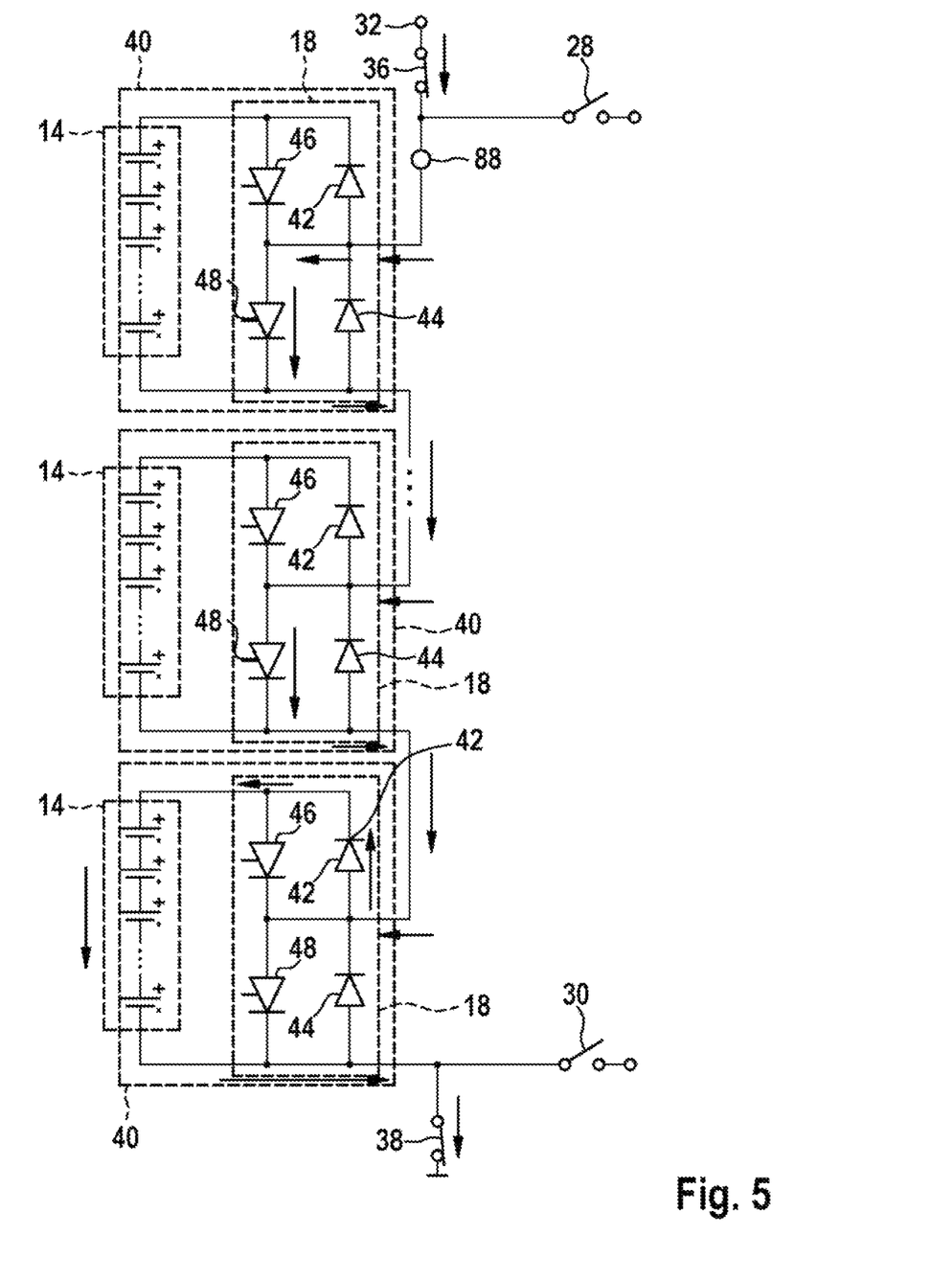
FIG. 5 shows the current course when charging a first battery module of the battery inside that first part of the circuit arrangement which is shown in FIG. 1.

The Following Function Results:

In order to determine the Coulombic efficiency of the individual battery modules 14 by means of the circuit arrangement 10, at least one of the battery modules 14 is selected and is connected in the current path 20 via one of the switching modules 18, while all other battery modules 14 are removed from the current path 20 via the other switching modules 18. The selected battery module 14 is then subjected to at least one discharging process and at least one charging process via the current path 20, the corresponding current being accurately set during charging and discharging of this battery module 14 in the current path 20 by means of the power semiconductor device 46, 48, 84, 86 operated in the linear mode, and the corresponding charge quantities $Q_{ab}$, $Q_{zu}$ during charging and discharging being determined by integrating the respective current over time using corresponding means (not shown). The Coulombic efficiency $C_E$ defined as $$C_E = \frac{Q_{ab}}{Q_{zu}}$$

is then determined from the charge quantities $Q_{ab}$, $Q_{zu}$ or variables proportional to the latter. The flowing current is measured, for example, using the current sensor 88 depicted in FIGS. 1, 4 and 5 (each switching module 18 additionally being able to contain a current sensor as well) and the cell voltages are determined in the individual modules by means of measuring chips (not shown).

FIG. 4 shows a discharging mode. The current in the corresponding unit 40 is controlled by accordingly switching the power semiconductor elements 46, 48. If both power semiconductor elements 46, 48 are turned off (bypass mode), the current flows into the module 18 in the discharging mode (the remaining cells 16 are discharged) and then flows out of the unit 40 again through the freewheeling diode 44. The cells 16 in the corresponding battery module 14 are effectively separated from the current path 20. If the power semiconductor element 46 is turned on, the cells 16 of the corresponding battery module 14 are in the current path 20 and the result is a current course which runs from the side of the battery module 14 having the lower potential, through the cells 16 of the battery module 14 and the power semiconductor element 46 and out of the switching module 18 to the next unit 40 or to the end point at the node between the freewheeling diodes 42, 44. This is the active mode.

During the charging process shown in FIG. 5, the power semiconductor elements 46, 48 in one of the units 40 are turned off, as a result of which the current flows through the corresponding battery module 14 of this unit 40, while the one power semiconductor element 48 is turned on in the other units 40, as a result of which the current flows only through the respective switching modules.

Figure 6:
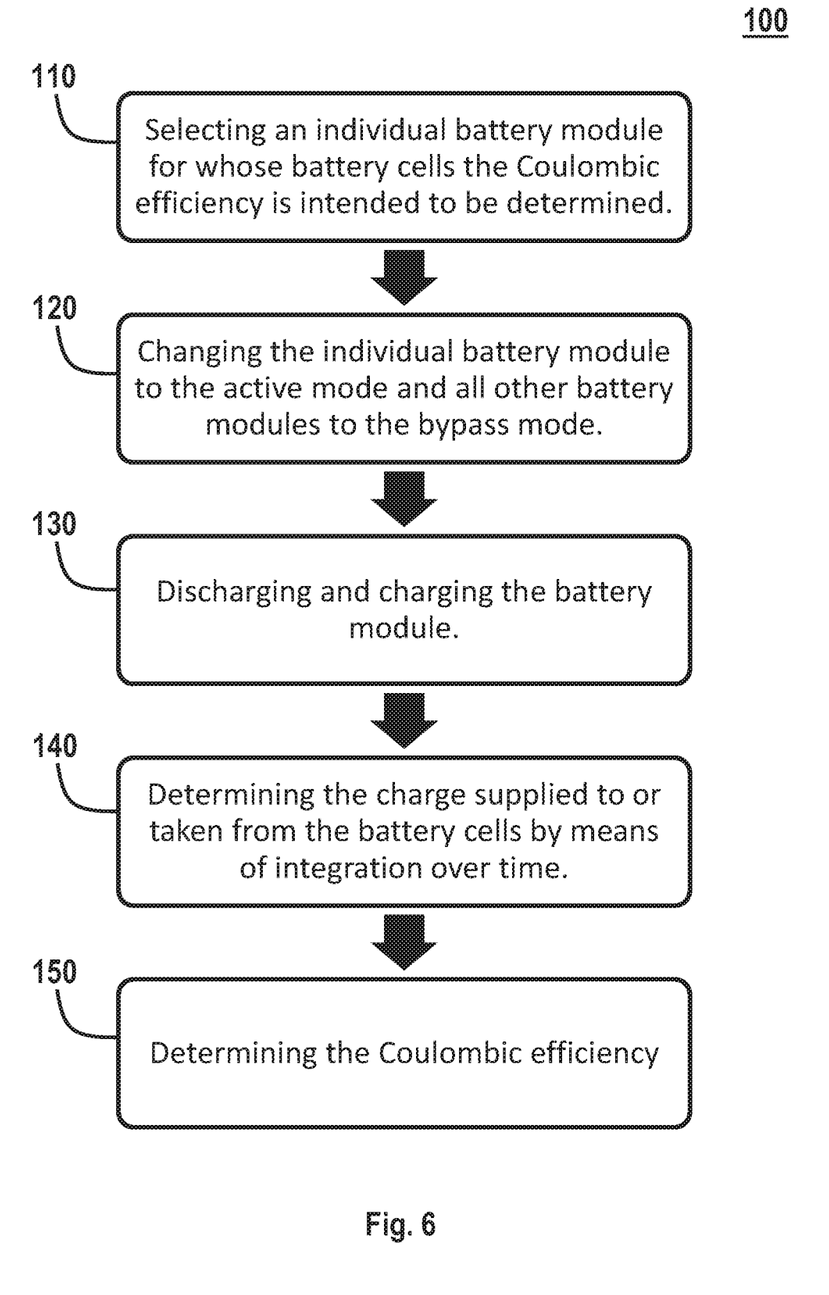
FIG. 6 shows a method for determining Coulombic efficiency

The method 100, shown in FIG. 6, according to the disclosure is started when the battery 12 is in the quiescent state and is connected to a charger (for example charging of an electric vehicle overnight). An individual battery module 14 of the battery 12, for whose battery cells the Coulombic efficiency $C_E$ is intended to be determined, is selected, for example the lowermost battery module 14 without restricting generality (block 110). The switching modules 18 of the circuit arrangement are now operated such that the current course illustrated in FIG. 4 results during discharging of the battery cells 16. The lowermost battery module 14 is in the active mode and all other battery modules are in the bypass mode (block 120). The contactors 28 and 30 are closed, with the result that the cells 16 are discharged via the inverter 58 and the connected motor 56 (see FIG. 2). In the lowermost unit 40, the current in the cells 16 of the battery module 14 of this unit 40 is regulated very accurately with the aid of the power semiconductor element 46 which now operates in the linear mode. This is possible since the discharging current needed to determine the Coulombic efficiency may be very small in comparison with the current flowing during normal operation. The losses in the power semiconductor element 46 therefore also remain small.

In the first embodiment, the resistor 74 which is generally present in battery direct converters is used to discharge the DC voltage intermediate circuit as the load resistor. This resistor 74 is optionally connected via the separate contactor 76 which is now closed for discharging.

In the second embodiment, the two power semiconductor elements 84, 86 in the inverter 58, which generate the three-phase AC voltage on the output side of the latter, are fully switched on. This operating mode is prohibited during normal operation since it produces a short circuit in the inverter. In this case, however, only the voltage of the battery module 14 connected in the current path 20 is present at the inverter 58, and the power semiconductor element 46 in the linear mode regulates the flowing discharging current.

In the third embodiment, two power semiconductor elements 84, 86 transistors are turned on in different phases, with the result that a current can flow through the motor 56 from the connection 52 to the connection 54, for example. A closed circuit is therefore produced and the required discharging current can flow, again regulated by the power semiconductor element 46. Since the windings are designed for alternating field operation, they act almost as a short circuit or small load in this embodiment. Since the currents provided for this discharging mode are very small in comparison with normal operation, there is no need for any special measures, for example for cooling or braking the motor 56.

In the fourth embodiment, the power semiconductor element 46 does not regulate the current in the linear mode, but rather one of the power semiconductor elements 84, 86 in the inverter 58, and the power semiconductor element 46 is turned on. In this case, all three of the previous embodiments are conceivable as a switching variant, but one or both of the power semiconductor elements 46 mentioned there is/are always operated in the linear mode (not turned on) in each case in order to regulate the current.

After the battery cells 16 of the lower module 14 have been discharged to the desired extent, the battery cells 16 are charged again (block 130) via a charger (connected to the connections 32, 34). In this case, the contactors 36, 38 are closed and the contactors 28, 30 are opened. The switching modules 18 in the battery direct converter are operated in such a manner that the current course illustrated in FIG. 5 results. The power semiconductor elements 46, 48 of the switching module 18 which is connected to the battery module 14 whose Coulombic efficiency is intended to be determined (that is to say the lowermost module in FIG. 5) are switched to the "open" switching position. In all other switching modules 18, one power semiconductor element 46 is switched to the "open" switching position and the other power semiconductor element 48 is switched to the "closed" switching position. One of the power semiconductor elements 48 of one of the switching modules 18 in which the Coulombic efficiency of the connected battery module 14 is not intended to be determined (for example the power semiconductor element 48 in the uppermost switching module 18) is operated in the linear mode in order to regulate the current in the current path 20. The current in the current path 20 is again measured using the current sensors installed in the module or an external sensor. The charging current and the discharging current are preferably selected to be the same.

The use of the uppermost switching module 18 in FIG. 5 can be considered to be only exemplary. The described current regulation can also be implemented using any other of the modules 18.

With the aid of the accurate current regulation or current measurement described, the charge supplied to or taken from the battery cells 16 can be determined very accurately by means of simple integration over time (block 140). The state of charge (SOC) of the cells 16 can likewise be accurately determined with the aid of the accurate voltage measurement which is present anyway according to the prior art. The prerequisites for determining the Coulombic efficiency CE (block 150) are therefore satisfied.

The invention claimed is:

1. A method for determining a Coulombic efficiency of a plurality of battery modules of a rechargeable battery with a circuit arrangement connected to the plurality of battery modules, the circuit arrangement having a common current path, the common current path having a plurality of switching modules connected in series between two output terminals that provide an output voltage, each switching module having a first terminal and a second terminal and being connected to a respective battery module in the plurality of battery modules, each switching module being configured to (i) selectively connect the respective connected battery module into the common current path by connecting the respective connected battery module between the respective first and second terminals and (ii) selectively remove the respective connected battery module from the common current path by connecting the respective first and second terminals to each other, the circuit arrangement having an inverter connected between the two output terminals in parallel with the common current path and configured to provide power from the output terminals to an electric consumer, the method comprising:

selecting at least one battery module of the plurality of battery modules;

operating the plurality of switching modules to (i) connect the selected at least one battery module into the common current path by connecting the selected at least one battery module being between the respective first and second terminals of the respective switching module and (ii) remove each other battery module is subjecting, while the selected at least one battery module is connected in the common current path and each other battery module is removed from the common current path, the selected at least one battery module to at least one discharging process and at least one charging process via the common current path;

operating at least one power semiconductor of the inverter in a linear mode to conduct and regulate a discharge current for the at least one discharging process;

determining charge quantities by integrating a charge current over a duration of the at least one charging process and integrating the discharge current over a duration of the at least one discharging process; and determining a Coulombic efficiency of the selected at least one battery module based on the determined charge quantities.

2. The method as claimed in claim 1, further comprising:
operating at least one power semiconductor of one of the switching modules in a linear mode to regulate the charge current for the at least one charging process.

3. The method as claimed in claim 1, wherein each of the switching modules has a half-bridge that includes two power semiconductor elements which act as semiconductor valves and two freewheeling diodes.

4. The method as claimed in claim 1, wherein the inverter has a DC voltage intermediate circuit connected in parallel with the common current path.

5. The method as claimed in claim 4, further comprising:
discharging the selected at least one battery module via the electrical consumer connected to the inverter, a connectable load resistor of the circuit arrangement, or a short circuit in the inverter.

6. The method as claimed in claim 1, further comprising:
arranging a connectable load resistor in parallel with the common current path; and
selectively connecting the connectable load resistor with a controllable switching device; and
discharging the selected at least one battery module via the connectable load resistor.

7. The method as claimed in claim 1, further comprising:
charging the selected at least one battery module via a charger connected to the common current path.

8. The method as claimed in claim 1, the determining of the Coulombic efficiency comprising:
determining the Coulombic efficiency of the selected at least one battery module based on a ratio of the determined charge quantities.

* * * * *